United States Patent
Goto et al.

[11] Patent Number: 6,144,261
[45] Date of Patent: Nov. 7, 2000

[54] METHOD OF STABILIZING HOLDOVER OF A PLL CIRCUIT

[75] Inventors: Masataka Goto, Tokyo; Yasuhiro Sato, Miyagi, both of Japan

[73] Assignee: NEC Corporation, Tokyo, Japan

[21] Appl. No.: 09/296,487

[22] Filed: Apr. 22, 1999

[30] Foreign Application Priority Data

Apr. 24, 1998 [JP] Japan ................................ 10-129698

[51] Int. Cl.[7] ............................. H03L 7/08; H03L 7/093
[52] U.S. Cl. ................................. 331/17; 331/25; 327/156
[58] Field of Search ..................... 331/16, 17, 18, 331/25; 327/156–159; 375/376; 455/260

[56] References Cited

U.S. PATENT DOCUMENTS 5,754,607 5/1998 Powell et al. ........................ 375/373

*Primary Examiner*—David Mis
*Attorney, Agent, or Firm*—McGuire Woods LLP

[57] ABSTRACT

PLL (Phase Locked Loop) circuits have difficulty achieving both short pull-in time and stable hold-over time simultaneously. The PLL circuit of the present invention includes a first integrator and a second integrator. To reduce a pull-in time, feedback loop including the first integrator is provided with a sufficiently great loop gain. For stable holdover, a feedback loop including the second integrator is provided with a loop gain small enough to obviate the influence of the momentary variation of an input signal frequency.

5 Claims, 1 Drawing Sheet

METHOD OF STABILIZING HOLDOVER OF
A PLL CIRCUIT

BACKGROUND OF THE INVENTION

The present invention relates to a PLL (Phase Locked Loop) circuit and more particularly to a PLL circuit including a frequency difference memorizing portion generally referred to as a secondary loop.

A PLL circuit produces an error signal representative of a difference between the phase of an input frequency and the phase of a frequency output from a VCO (Voltage Controlled Oscillator). The PLL circuit controls the oscillation frequency of the VCO by feedback control such that the above error signal decreases to substantially zero. While so-called PI (Proportional and Integral) control and PDI (Proportional, Differential and Integral) control have customarily been used to improve a feedback control characteristic, PI control is usually applied to the PLL circuit. The PLL circuit with the PI control scheme controls the oscillation frequency of the VCO with the sum of a voltage proportional to the error signal and a voltage proportional to the time integral of the error signal.

When the PLL circuit is built in a communication apparatus, particularly in a synchronous multiplexing device called SDH, it is necessary to reduce a pull-in time. Also, when a clock source for synchronization, i.e., the phase of the input signal frequency is lost, a control voltage corresponding to a difference between the input signal frequency and the self-running frequency of the VCO must be memorized as the output voltage of an integrator so as to maintain the output frequency of the VCO accurate despite the absence of the clock source (so-called holdover).

However, the conventional PLL circuit cannot achieve both of the short pull-in time and stable holdover at the same time.

Technologies relating to the present invention are disclosed in, e.g., Japanese Patent Laid-Open Publication Nos. 2-280414, 6-252746, 7-193497 and 8-84071, and Japanese Patent No. 2,527,010.

SUMMARY OF THE INVENTION

It is therefore an object of the present invention to provide a PLL circuit capable of enhancing stable holdover while maintaining the pull-in time short.

In accordance with the present invention, in a PLL circuit for producing an error signal representative of a difference between the phase of an input frequency signal and the phase of the output frequency of a VCO, adding a voltage proportional to the error signal and a voltage proportional to the time integral of the error signal to thereby output a sum voltage, and controlling the oscillation frequency of the VCO with the sum voltage by feedback control, the voltage proportional to the time integral of the error signal is the sum of the output voltage of a first integrator and the output voltage of a second integrator. A feedback loop including the first integrator is provided with a loop gain great enough to reduce a pull-in time. A feedback loop including the second integrator is provided with a loop gain small enough to hold over an integrated voltage corresponding to a mean value of differences between the frequencies of the input frequency signal and the self-running frequency of the VCO appeared over a relatively long period of time.

Also, in accordance with the present invention, a PLL circuit of the type described a first adder for detecting a voltage proportional to a difference between the phase of the input frequency signal and the phase of the output frequency of the VCO, a first multiplier for multiplying the output of the first adder by a constant K1, a second multiplier for multiplying the output of the first multiplier by a constant K2, a second adder for adding the output of the second multiplier, a first integrator for the integrating the output voltage of the second adder with the elapse of time, a third multiplier for multiplying the output of the first integrator by a constant K3, a negative feedback loop for causing the second adder to subtract the output voltage of the third multiplier, a second integrator for integrating the output voltage of the third multiplier, and a third adder for adding the output voltage of the first multiplier, the output of the first integrator and the output voltage of the second integrator. A controller controls the oscillation frequency of the VCO with the output voltage of the third adder.

BRIEF DESCRIPTION OF THE DRAWINGS

The above and other objects, features and advantages of the present invention will become more apparent from the following detailed description taken with the accompanying drawings in which.

In the drawings, identical reference numerals designate identical structural elements.

Figure 1:
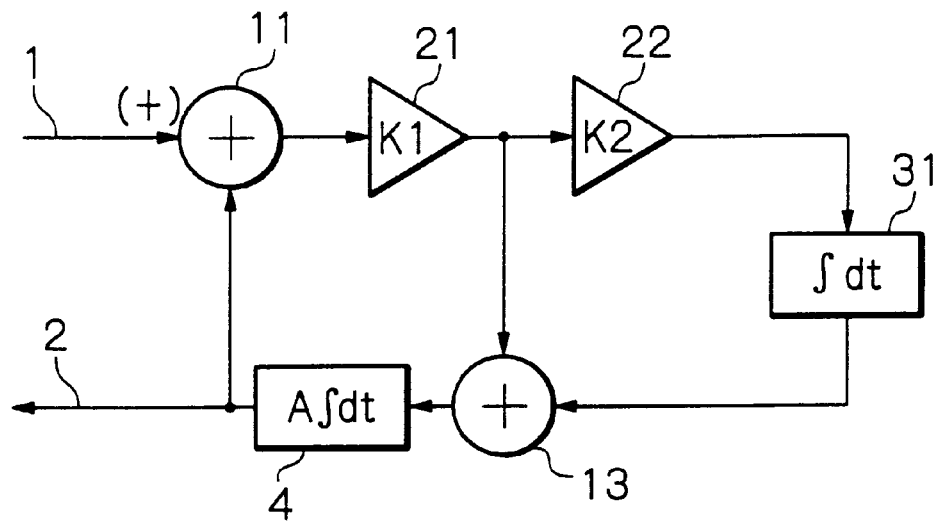
FIG. 1 is a block diagram schematically showing a conventional PLL circuit.

DESCRIPTION OF THE PREFERRED
EMBODIMENT

To better understand the present invention, brief reference will be made to a conventional PLL circuit, shown in FIG. 1. As shown, the PLL circuit includes a first adder or phase difference detector 11. The first adder 11 transforms a difference between the phase of an input signal frequency and the phase of an output frequency to an error signal voltage. A first multiplier (K1) 21 multiplies the error signal voltage by a constant K1 to thereby produce a voltage proportional to the error signal. The voltage output from the multiplier 21 is input to a third adder 13.

A second multiplier (K2) 22 multiplies the output of the first multiplier 21 by a constant K2. A first integrator 31 integrates the output of the second multiplier 22 with the elapse of time and thereby produces a voltage proportional to the time integral of the error signal. The third adder 13 adds the output voltage of the multiplier 21 and the output voltage of the first integrator 31. A VCO 4 has its oscillation frequency controlled by the resulting output of the third adder 13. As a result, the VCO 4 outputs the phase 2 of the output frequency in the form of a time integral of frequency.

For feedback control, the above PLL circuit often controls the oscillation frequency of the VCO 4 by using only the voltage proportional to the error signal. In this sense, the portion of the circuit including the second multiplier 22 and first integrator 31 is referred to as a secondary loop. The output voltage of the integrator 31 memorizes a control voltage corresponding to a difference between the self-running frequency of the VCO 4 and the input signal frequency. The secondary loop is therefore essential when the input phase 1 is likely to disappear.

When the PLL circuit is built in a transmission apparatus, particularly in a synchronous multiplexing device called SDH, it is necessary to reduce the pull-in time. Also, when a clock source for synchronization, i.e., the phase of the input signal frequency is lost, a control voltage corresponding to a difference between the input signal frequency and the self-running frequency of the VCO 4 must be memorized as the output voltage of the integrator 31 so as to maintain the output frequency of the VCO 4 accurate despite the absence of the clock source.

The pull-in time is represented by the reciprocal of a loop gain. In FIG. 1, assume that the loop consisting of the first multiplier 21, second multiplier 22, first integrator 31 and VCO 4 has a loop gain of K1×K2×A. Then a period of time T1 necessary for 90% pull-in is expressed as:

$$T1=2.3/\{K1 \times K2 \times A\} \qquad \text{Eq. (1)}$$

On the elapse of the above period of time T1, the output of the first adder 11 becomes substantially zero.

To reduce the pull-in time T1, i.e., to cause the output of the first integrator 31 to rapidly reach the final integral value, the constant K2 and therefore the loop gain may be increased. This, however, renders the final integral susceptible to the momentary variation of the input signal and thereby obstructs stable holdover.

To solve the above problem, it is necessary to prolong the time when the output of the integrator 31 reaches the final integral value. That is, the final integrated value of the integrator 1 must be determined by the mean value of input signal frequencies appeared over a relatively long period of time. This, however, undesirably increases the pull-in time.

Figure 2:
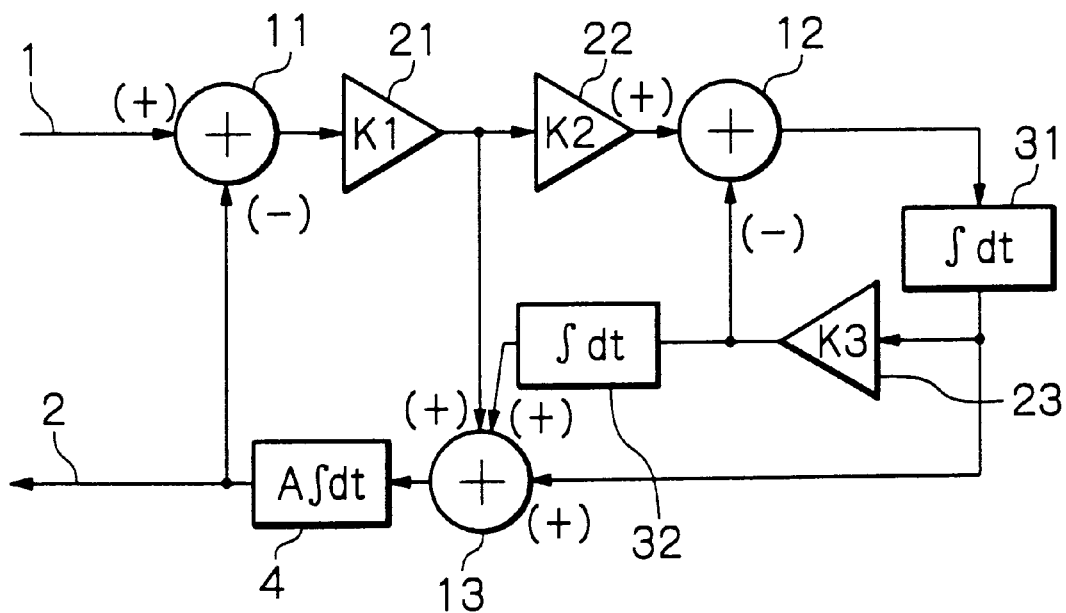
FIG. 2 is a block diagram schematically showing a PLL circuit embodying the present invention.

Referring to FIG. 2, a PLL circuit embodying the present invention will be described. As shown, the PLL circuit includes a third multiplier (K3) 23, a second integrator 32 and a second adder 12 in addition to the structural elements of the conventional PLL circuit shown in FIG. 1. The third multiplier 23 multiples the output of the first integrator 31 by a constant K3. The second integrator 32 integrates the output of the third multiplier 23. The second adder 12 subtracts the output of the third multiplier 23 from the output of the second multiplier 22.

The first integrator 32 integrates the output of the second adder 12. The third adder 13 adds the output of the first multiplier 21 (voltage proportional to the error signal), the output of the first integrator 31 (first voltage) and the output of the second integrator 32 (second voltage) and controls the oscillation frequency of the VCO 4 with the resulting sum.

As for the output of the first integrator 31, the illustrative embodiment is smaller than the conventional circuit of FIG. 1 by the time integral of the output of the third multiplier 23. However, in the illustrative embodiment, the second integrator 32 feeds to the third adder 13 a time integral identical with the time integral of the output of the third multiplier 23. Consequently, the output of the adder 13 shown in FIG. 2 is exactly the same as the output of the adder 13 shown in FIG. 1. It follows that the illustrative embodiment has the same loop gain as the conventional circuit of FIG. 1 and has the same pull-in time T1 represented by the Eq. (1).

In the illustrative embodiment, the output of the first integrator 31 is negatively fed back via the third multiplier 23 and therefore gradually decreases, causing the output of the second integrator 32 to increase accordingly. When the value of the error signal output from the first adder 11 decreases, the polarity of the output of the second adder 12 is inverted. As a result, the output of the first integrator 31 gradually decreases toward zero, so that a voltage necessary for holdover is implemented only by the output of the second integrator 32.

The feedback loop including the second integrator 32 has a loop gain of K1×K2×K3×A. Assume that a period of time T2 is necessary for the second integrator 32 to store a voltage corresponding to a difference between the input signal frequency and the self-running frequency of the VCO 4. Then, the period of time T2 is expressed as:

$$T2=2.3/\{K1 \times K2 \times K3 \times A\} \qquad \text{Eq. (2)}$$

As the above Eq. (2) indicates, by reducing the constant K3, it is possible to implement a necessary period of time T2 for thereby obviating the influence of the ;momentary variation of the input signal frequency.

In summary, it will be seen that the present invention provides a PLL circuit capable of achieving both of a short pull-in time and stable holdover. For a short pull-in time, the PLL circuit provides a feedback loop including a first integrator with a sufficiently great loop gain. For stable holdover, the PLL circuit provides a feedback loop including a second integrator with a loop gain small enough to obviate the influence of the momentary variation of an input signal frequency.

Various modifications will become possible for those skilled in the art after receiving the teachings of the present disclosure without departing from the scope thereof. For example, in the illustrative embodiment, the second integrator 32 integrates the output of the third multiplier 23 which is the amount of negative feedback to the first integrator 31. Alternatively, a fourth multiplier may be provided for multiplying the output of the second multiplier 22 by a constant K4, in which case the second integrator 32 will integrate the output of the fourth multiplier. Such an alternative arrangement also achieves the above advantages if the constant K4 is small.

The PLL circuit shown in FIG. 2 may, of course, be partly or entirely implemented by a digital operation circuit.

What is claimed is:

1. In a PLL (Phase Locked Loop) circuit for producing an error signal representative of a difference between phase of an input frequency signal and a phase of an output frequency of a VCO (Voltage Controlled Oscillator), adding a voltage proportional to said error signal and first and second voltages proportional to time integrals of said error signal to thereby output a sum voltage, and controlling an oscillation frequency of said VCO with said sum voltage by feedback control, the first and second voltages proportional to time integrals of the error signal comprising an output voltage of a first integrator and an output voltage of a second integrator, respectively, a feedback loop including said first integrator is provided with a loop gain great enough to reduce a pull-in time, and a feedback loop including said second integrator is provided with a loop gain small enough to hold over an integrated voltage corresponding to a mean value of differences between frequencies of the input frequency signal and a self-running frequency of said VCO.

2. A PLL circuit as claimed in claim 1, wherein said first integrator integrates a difference between an output voltage of a first and second multiplier for multiplying the voltage proportional to the error signal by constants K1 and K2 and a feedback voltage output from a third multiplier for multiplying an output voltage of said first integrator by a constant K3.

3. A PLL circuit as claimed in claim 2, wherein said second integrator integrates a feedback voltage output from said third multiplier.

4. A phase locked loop (PLL) circuit for producing an error signal representative of a difference between a phase of an input frequency signal and a phase of an output frequency of a voltage controlled oscillator (VCO), adding a voltage proportional to said error signal and a voltage proportional to time integrals of said error signal to thereby output a sum voltage, and controlling an oscillation frequency of said VCO with same sum voltage by feedback control, said PLL circuit comprising:

a first adder for detecting a voltage proportional to a difference between the phase of the input frequency signal and the phase of the output frequency of the VCO and produce an output voltage proportional to the difference;

a first multiplier for multiplying the output of said first adder by a constant K1;

a second multiplier for multiplying an output of said first multiplier by a constant K2;

a second adder for adding an output of said second multiplier;

a first integrator for integrating an output voltage of said second adder with the elapse of time;

a third multiplier for multiplying an output of said first integrator by a constant K3;

a negative feedback loop for causing said second adder to subtract an output voltage of said third multiplier;

a second integrator for integrating an output voltage of said third multiplier;

a third adder for adding the output voltage of said first multiplier, the output of said first integrator and the output voltage of said second integrator; and control means for controlling an oscillation frequency of the VCO with an output voltage of said third adder.

5. A PLL circuit as claimed in claim 4, wherein at least a part of said PLL circuit is implemented by a digital operation circuit.

* * * * *